United States Patent
Tsai et al.

(10) Patent No.: US 8,509,026 B2
(45) Date of Patent: Aug. 13, 2013

(54) WORD LINE BOOST CIRCUIT

(75) Inventors: Yu-Hsiung Tsai, Hsinchu (TW); Po-Hao Lee, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 67 days.

(21) Appl. No.: 13/346,734

(22) Filed: Jan. 10, 2012

(65) Prior Publication Data
US 2013/0176808 A1 Jul. 11, 2013

(51) Int. Cl.
*G11C 8/08* (2006.01)
(52) U.S. Cl.
USPC ............... 365/230.06; 365/189.11; 365/194
(58) Field of Classification Search
None
See application file for complete search history.

(56) References Cited

U.S. PATENT DOCUMENTS

| | | | |
|---|---|---|---|
| 5,390,147 A | | 2/1995 | Smarandoiu et al. |
| 5,400,279 A | * | 3/1995 | Momodomi et al. .... 365/185.17 |
| 5,504,715 A | * | 4/1996 | Lee et al. ................. 365/230.06 |
| 6,567,310 B2 | | 5/2003 | Einaga et al. |
| 7,697,349 B2 | | 4/2010 | Lin |

* cited by examiner

*Primary Examiner* — Tan T. Nguyen
(74) *Attorney, Agent, or Firm* — Jianq Chyun IP Office

(57) ABSTRACT

A word line boost circuit including a first address transfer detector, a second address transfer detector and a boost operation unit is provided. The first address transfer detector generates a first detection pulse in response to variation of a row address signal. The second address transfer detector generates a second detection pulse in response to variation of a column address signal. Moreover, the boost operation unit generates a selection voltage by using a boost voltage according to the first detection pulse, and determines whether or not to use the boost voltage to generate the selection voltage according to a delay time between the first detection pulse and the second detection pulse.

20 Claims, 5 Drawing Sheets

WORD LINE BOOST CIRCUIT

BACKGROUND OF THE INVENTION

1. Field of the Invention

The invention relates to a boost circuit. Particularly, the invention relates to a word line boost circuit.

2. Description of Related Art

FIG. 1 is a bias schematic diagram of a conventional memory unit in reading. Referring to FIG. 1, the conventional memory unit 100 includes a select transistor MS1 and a memory cell MC1. During the read operation, a word line driver (not shown) provides a selection voltage of −1.2V to a word line WL1, and a voltage of 1.8V is applied on a source line SL1, so as to turn on the select transistor MS1. Moreover, voltages of 1.8V and 0.3V are respectively applied on a control line CL1 and a bit line BL1. In this way, a sensing circuit in a memory device can determine a state of the memory cell MC1 according to a magnitude of a sensing current 101.

Moreover, before the read operation, the word line driver provides an operation voltage of 1.8V to the word line WL1. In other words, during the read operation, the word line driver has to provide the selection voltage (−1.2V) lower than the operation voltage (1.8V) to the word line WL1. Therefore, in an actual application, the memory device includes a word line boost circuit, and the word line boost circuit generates the selection voltage in a manner of negative boosting. Generally, the conventional word line boost circuit detects variation of a column-row address signal through an address transfer detector. When the column-row address signal is varied, a booster in the conventional word line boost circuit generates a boost voltage of −1.2V, so that the conventional word line boost circuit can generate the selection voltage by using the boost voltage.

For example, FIG. 2 is a signal waveform diagram of the conventional word line boost circuit, in which a column-row address signal PA1 has 12 bits, and only the front 4 bits PAY<0>-PAY<3> and a twelfth bit PAX<11> of the column-row address signal PA1 are shown in FIG. 2. Moreover, the front 5 bits of the column-row address signal PA1 are used to represent a bit line address (BL address), and the remained 7 bits are used to represent a word line address (WL address). Moreover, KICKB represents a boost clock signal formed by boost pulses which determines the timing of boost operation, VBB represents an output signal of the booster in the conventional word line boost circuit, ENBOOST represents a signal formed by enable pulses which determines the timing of switching operation, and ZWL represents a signal received by the word line WL1.

As shown in FIG. 2, during a period between time points t21 and t22, the row address of the selected memory unit is not varied and selects the same word line WL1. However, although the row address of the selected memory unit is not varied, as the column address of the memory unit is varied, the conventional word line boost circuit continually performs boost operations according to boost pulses P21-P25 and continually generates enable pulses in the signal ENBOOST, so as to continually switch the output signal VBB from 0V to −1.2V. Therefore, in the actual operation, power consumption of the conventional word line boost circuit is very high.

SUMMARY OF THE INVENTION

The invention is directed to a word line boost circuit, which selectively performs a boost operation according to a first detection pulse and a second detection pulse, so as to reduce power consumption of the circuit.

The invention is directed to a word line boost circuit, which reduces power consumption by reducing the times of boost operations.

The invention is directed to a word line boost circuit, which reduces power consumption by disabling a boost clock signal.

The invention provides a word line boost circuit including a first address transfer detector, a second address transfer detector and a boost operation unit. The first address transfer detector generates a first detection pulse in response to variation of a row address signal. The second address transfer detector generates a second detection pulse in response to variation of a column address signal. Moreover, the boost operation unit generates a selection voltage by using a boost voltage according to the first detection pulse, and determines whether or not to use the boost voltage to generate the selection voltage according to a delay time between the first detection pulse and the second detection pulse.

In an embodiment of the invention, the boost operation unit includes a controller, a booster and a switching device. The controller sequentially generates a boost pulse and an enable pulse according to the first detection pulse, and determines whether or not to sequentially generate the boost pulse and the enable pulse according to the delay time. The booster generates the boost voltage according to the boost pulse. The switching device switches the selection voltage to the boost voltage according to the enable pulse.

In an embodiment of the invention, when the delay time is greater than a predetermined time, the controller sequentially generates the boost clock and the enable pulse. Moreover, when the delay time is smaller than or equal to the predetermined time, the controller does not generate the boost pulse.

In an embodiment of the invention, when the delay time is greater than a predetermined time, the boost operation unit generates the selection voltage by using the boost voltage. Moreover, when the delay time is smaller than or equal to the predetermined time, the boost operation unit will not re-generate the boost voltage.

The invention provides a word line boost circuit including a first address transfer detector, a second address transfer detector and a boost operation unit. The first address transfer detector determines whether or not to generate a first detection pulse according to a row address signal. The second address transfer detector determines whether or not to generate a second detection pulse according to a column address signal. Moreover, the boost operation unit switches a selection voltage to a boost voltage according to the first detection pulse, and determines whether or not to switch the selection voltage to the boost voltage according to a delay time between the first detection pulse and the second detection pulse.

In an embodiment of the invention, when the delay time is greater than a predetermined time, the boost operation unit switches the selection voltage to the boost voltage. Moreover, when the delay time is smaller than or equal to the predetermined time, the boost operation unit stops re-generating the boost voltage.

The invention provides a word line boost circuit for boosting a boost voltage in a memory array which designates a selected memory cell by a word line address and a bit line address, and the word line boost circuit includes a first address transfer detector, a second address transfer detector and a boost operation unit. The first address transfer detector detects variation of the word line address. The second address transfer detector detects variation of the bit line address. The boost operation unit generates a boost clock signal according to the detected results of the first address transfer detector and the second address transfer detector. Wherein, the boost clock is disabled when the selected memory cell is designated at the same word line address.

According to the above descriptions, the first address transfer detector and the second address transfer detector are used to generate the first detection pulse and the second detection pulse. Moreover, the boost operation unit determines whether or not to perform a boost operation according to the first detection pulse and the second detection pulse. In this way, when the column address of the selected memory unit is changed, the boost operation unit can selectively perform the boost operation, so as to reduce the power consumption of the word line boost circuit.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
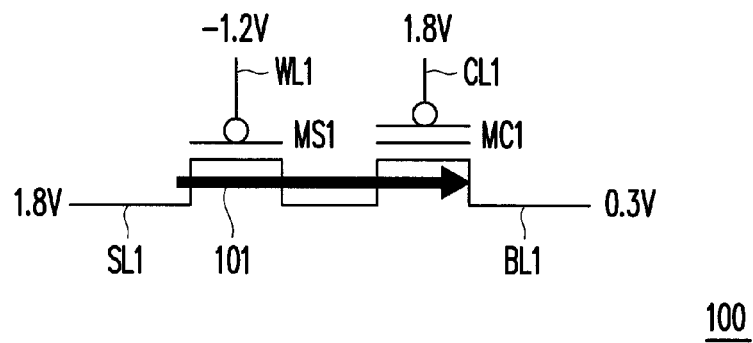
FIG. 1 is a bias schematic diagram of a conventional memory unit in reading.
Figure 2:
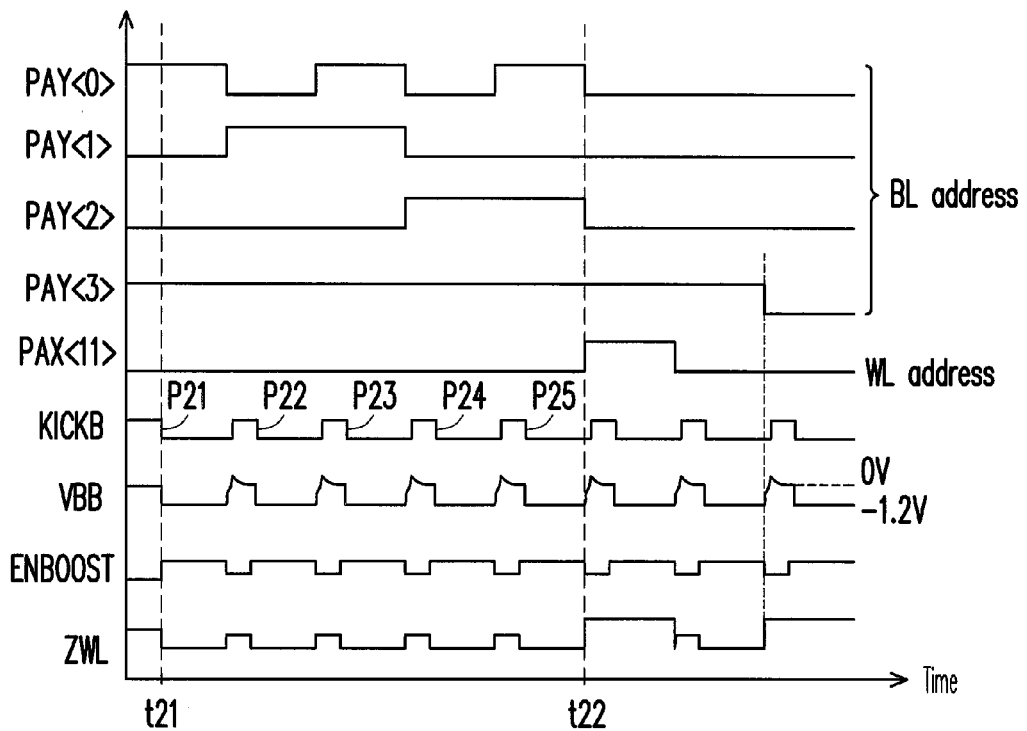
FIG. 2 is a signal waveform diagram of a conventional word line boost circuit.
Figure 3:
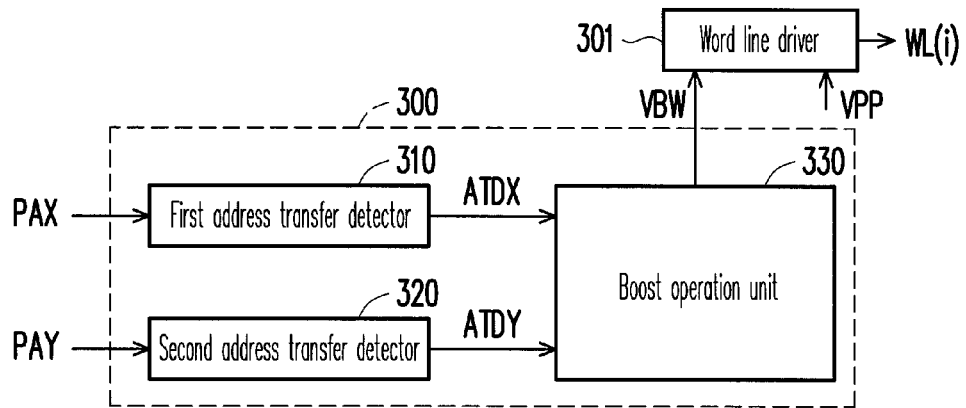
FIG. 3 is a block schematic diagram of a word line boost circuit according to an embodiment of the invention.

FIG. 3 is a block schematic diagram of a word line boost circuit according to an embodiment of the invention. Referring to FIG. 3, in an actual application, the word line boost circuit 300 is used to provide a selection voltage VBW to a word line driver 301, and the word line driver 301 further receives an operation voltage VPP. In this way, the word line driver 301 can selectively provide the selection voltage VBW or the operation voltage VPP to a word line WL(i) according to a row address signal PAX and a column address signal PAY. Besides, the row address signal PAX is used to represent a word line address, the column address signal PAY is used to represent a bit line address, and a selected memory cell in a memory array is designated by the word line address and the bit line address.

Referring to FIG. 3, the word line boost circuit 300 includes a first address transfer detector 310, a second address transfer detector 320 and a boost operation unit 330. The first address transfer detector 310 and the second address transfer detector 320 are electrically connected to the boost operation unit 330.

In operation, the first address transfer detector 310 determines whether or not to generate a first detection pulse ATDX according to the row address signal PAX. For example, when the row address signal PAX is varied, the first address transfer detector 310 generates the first detection pulse ATDX in response to the variation of the row address signal PAX. In other words, the first address transfer detector 310 detects the variation of the word line address. When the row address signal PAX is used to select a different word line, i.e. when the word line address is varied, the variation of the word line address is detected by the first address transfer detector 310, and then the first address transfer detector 310 generates the first detection pulse ATDX.

On the other hand, the second address transfer detector 320 determines whether or not to generate a second detection pulse ATDY according to the column address signal PAY. For example, when the column address signal PAY is varied, the second address transfer detector 320 generates the second detection pulse ATDY in response to the variation of the column address signal PAY. In other words, the second address transfer detector 320 detects the variation of the bit line address. When the column address signal PAY is used to select a different bit line, i.e. when the bit line address is varied, the variation of the bit line address is detected by the second address transfer detector 320, and then the second address transfer detector 320 generates the second detection pulse ATDY.

Moreover, the boost operation unit 330 generates the selection voltage VBW by using a boost voltage according to the first detection pulse ATDX. Besides, the boost operation unit 330 performs a boost operation by enabling a boost clock signal so as to generate the boost voltage. For example, when the row address signal PAX selects the different word line, the boost operation unit 330 enables the boost clock signal to performs the boost operation and generate the boost voltage. Moreover, the boost operation unit 330 switches the selection voltage VBW to the boost voltage, so as to provide the selection voltage VBW higher or lower than the operation voltage VPP. In other words, in an exemplary embodiment, when the row address signal PAX selects the different word line, the boost operation unit 330 switches the selection voltage VBW to the boost voltage according to the first detection pulse ATDX.

On the other hand, when the row address signal PAX and the column address signal PAY are sequentially varied, the boost operation unit 330 determines whether or not to use the boost voltage to generate the selection voltage VBW according to a delay time between the first detection pulse ATDX and the second detection pulse ATDY. For example, if the column address signal PAY is varied after the row address signal PAX is varied, i.e. the second detection pulse ATDY is generated after the first detection pulse ATDX is generated, the boost operation unit 330 calculates the delay time between the detection pulses ATDX and ATDY, i.e. detects a time difference of the pulses ATDX and ATDY.

Moreover, when the delay time is greater than a predetermined time (for example, 1 μs), the boost operation unit 330 enables the boost clock signal to generate the boost voltage and uses the boost voltage to generate the selection voltage VBW. Namely, in an exemplary embodiment, the boost operation unit 330 switches the selection voltage VBW to the boost voltage. Comparatively, when the delay time is smaller than or equal to the predetermined time, the boost operation unit 330 disables the boost clock signal to stop generating the boost voltage. Namely, in an exemplary embodiment, the boost operation unit 330 does not switch the selection voltage VBW.

In this way, when the row address signal PAX selects the different word line, i.e. when a row address of the selected memory unit is varied, the voltage operation unit 330 performs the boost operation. However, when the column address signal PAY selects the different bit line, i.e. when a column address of the selected memory unit is varied, the boost operation unit 330 selectively performs the boost operation, so as to reduce the power consumption of the bit line boost circuit 300.

Figure 4:
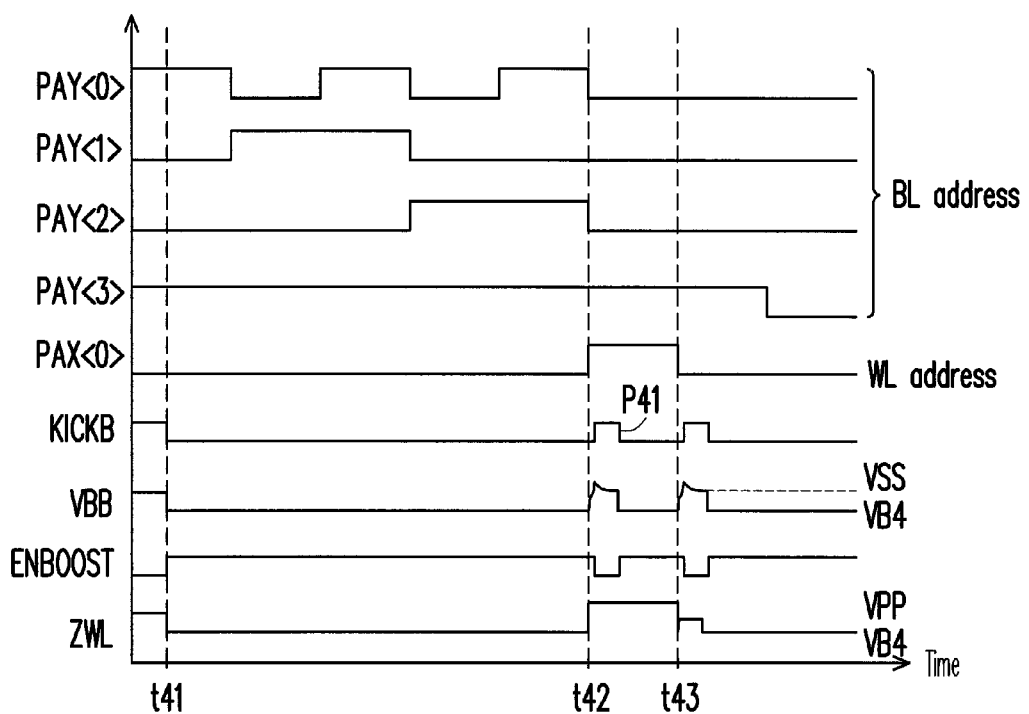
FIG. 4 is a timing diagram of a word line boost circuit according to an embodiment of the invention.

For example, FIG. 4 is a timing diagram of the word line boost circuit according to an embodiment of the invention, in which the column address signal PAY has 5 bits, and only front 4 bits PAY<0>-PAY<3> of the column address signal PAY are shown in FIG. 4. The row address signal PAX has 7 bits, and only a first bit PAX<0> of the row address signal PAX is shown in FIG. 4. Moreover, KICKB represents a boost clock signal formed by boost pulses which determines the timing of boost operation, VBB represents an output signal of a booster in the boost operation unit 330, ENBOOST represents a signal formed by enable pulses which determines the timing of switching operation, and ZWL represents a signal received by the word line WL(i).

As shown in FIG. 4, during a period between time points t41 and t42, the row address signal PAX is not varied and selects the same word line WL(i). Moreover, during the period between the time points t41 and t42, the front three bits PAY<0>-PAY<2> of the column address signal PAY are varied, so that the second address transfer detector 320 sequentially generates a plurality of second detection pulses ATDY. Moreover, the boost operation unit 330 compares each of the second detection pulses ATDY with the previous first detection pulse ATDX to obtain a plurality of delay time. Moreover, since the plurality of delay time are all smaller than the predetermined time, none boost pulse is appeared in the boost clock signal KICKB between the time points t41 and t42, so that the booster in the boost operation unit 330 does not perform the boost operation during such period. Beside, between the time points t41 and t42, none enable pulse is appeared in the signal ENBOOST, i.e. the level of the signal ENBOOST doesn't change, so that the boost operation unit 330 does not switch the selection voltage VBW. In this way, the power consumption of the word line boost circuit 300 is reduced.

Then, the first bit PAX<0> of the row address signal PAX is varied at the time point t42. Now, the first address transfer detector 310 generates a new first detection pulse ATDX, and the boost operation unit 330 generates a boost pulse P41 according to the new first detection pulse ATDX. Therefore, during a period between the time points t42 and t43, the booster in the boost operation unit 330 performs a negative boost operation according to the boost pulse P41, so as to switch the output signal VBB from a ground voltage VSS to a boost voltage VB4. Moreover, since the row address signal PAX is not addressed to the word line WL(i), the word line driver 301 provides the operation voltage VPP to the word line WL(i).

Figure 5:
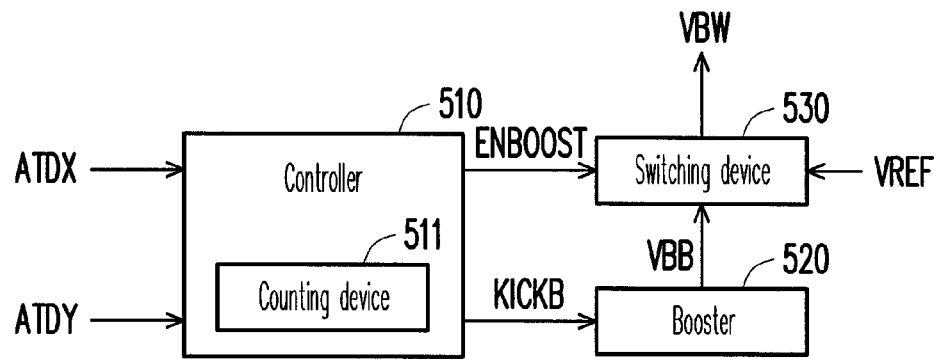
FIG. 5 is block diagram of a boost operation unit according to an embodiment of the invention.
Figure 6:
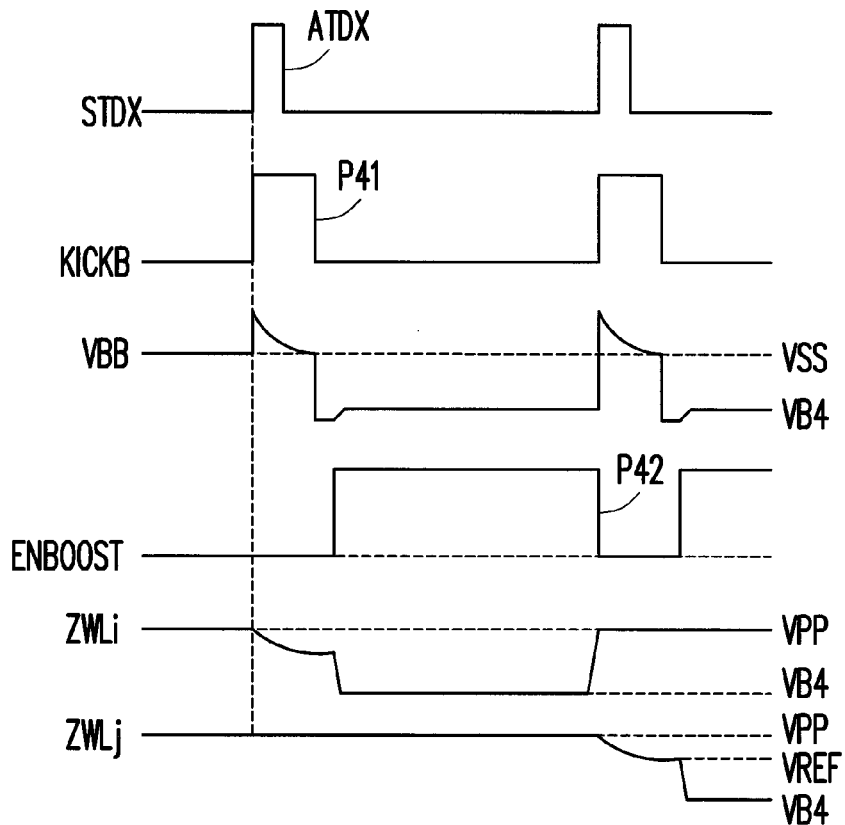
FIG. 6 is a signal waveform diagram of a boost operation unit.

In order to fully convey the spirit of the invention to those skilled in the art, details of the invention are described below. FIG. 5 is block diagram of a boost operation unit according to an embodiment of the invention, and FIG. 6 is a signal waveform diagram of the boost operation unit. Detailed operations of the boost operation unit are descried below with reference of FIG. 5 and FIG. 6.

The boost operation unit 330 further includes a controller 510, a booster 520 and a switching device 530, where the controller 510 includes a counting device 511. The controller 510 is electrically connected to the booster 520, and the switching device 530 is electrically connected to the booster 520 and the controller 510. In operation, when the row address signal PAX is varied, the controller 510 sequentially generates a boost pulse P41 and an enable pulse P42 according to the first detection pulse ATDX. Wherein, STDX of FIG. 6 represents a first detection signal formed by the first detection pulse ATDX, KICKB represents a boost clock signal formed by the boost pulse P41, and ENBOOST represents a signal formed by the enable pulse P42.

Figure 7:
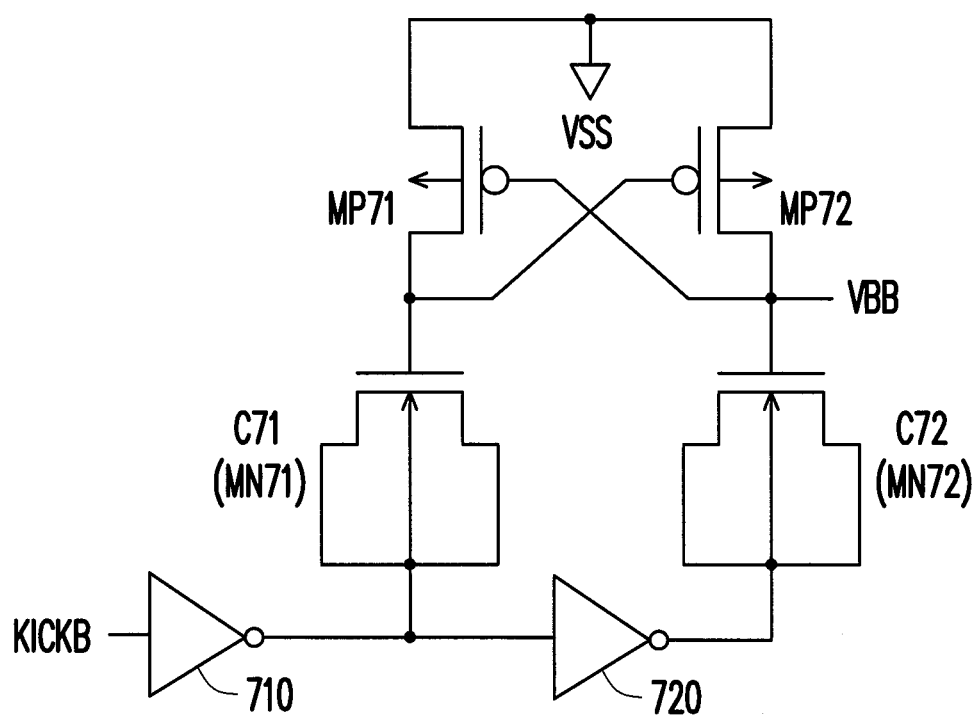
FIG. 7 is a circuit diagram of a booster according to an embodiment of the invention.

Moreover, the booster 520 performs the boost operation according to the boost pulse P41, and generates a boost voltage VB4. The detail structure of the booster 520 is further described as below. FIG. 7 is a circuit diagram of a booster according to an embodiment of the invention. Referring to FIG. 7, the booster 520 includes a P-channel metal oxide semiconductor (PMOS) transistor MP71, a PMOS transistor MP72, a capacitor C71 formed by an N-channel metal oxide semiconductor (NMOS) transistor MN71, a capacitor C72 formed by an NMOS transistor MN72, an inverter 710 and an inverter 720. Here, sources of the PMOS transistors MP71 and MP72 receive the ground voltage VSS, and drains of the PMOS transistors MP71 and MP72 are respectively connected to first ends of the capacitors C71 and C72.

Moreover, a gate of the PMOS transistor MP71 is electrically connected to the drain of the PMOS transistor MP72, and a gate of the PMOS transistor MP72 is electrically connected to the drain of the PMOS transistor MP71. Moreover, an input terminal of the inverter 710 receives the boost clock signal KICKB, and an output terminal of the inverter 710 is electrically connected to a second end of the capacitor C71. An input terminal of the inverter 720 is electrically connected to the output terminal of the inverter 710, and an output terminal of the inverter 720 is electrically connected to a second end of the capacitor C72. In operation, when a boost pulse of the boost clock signal KICKB is input, the inverters 710 and 720 respectively pull up the second end of the capacitors C71 and C72 to different voltage levels. Now, voltage levels of the first ends of the capacitors C71 and C72 are accordingly varied, so as to generate the boost voltage VB4.

Referring to FIG. 6, the booster 520 performs the negative boost operation, so that an output signal VBB of the booster 520 is switched from the ground voltage VSS to the boost voltage VB4. Moreover, the switching device 530 switches the selection voltage VBW to the boost voltage VB4 according to the enable pulse P42. In this way, a signal ZWLj applied to a word line designated by the row address signal PAX is switched from the operation voltage VPP to the boost voltage VB4 through the word line driver. Beside, a signal ZWLi applied to a word line previously designated by the row address signal PAX is switched from the boost voltage VB4 to the operation voltage VPP.

In an exemplary embodiment, the switching device 530 further receives the first detection pulse ATDX and the second detection pulse ATDY. In this way, when the controller 510 generates the boost pulse P41 and the enable pulse P42 according to the first detection pulse ATDX, the switching device 530 can further switch the selection voltage VBW to a reference voltage VREF according to the first detection pulse ATDX before switching the selection voltage VBW to the boost voltage VB4. In this way, as shown in FIG. 6, in a process that the signal ZWLj on the word line is switched from the operation voltage VPP to the boost voltage VB4, it is first switched to the reference voltage VREF, which avails improving operation performance of the memory unit.

On the other hand, when the row address signal PAX and the column address signal PAY are sequentially varied, the controller 510 determines whether or not to sequentially generate the boost pulse P41 and the enable pulse P42 according to the delay time between the first detection pulse ATDX and the second detection pulse ATDY. For example, the controller 510 determines a magnitude of the delay time according to a counting value generated by the counting device 511. The counting device 511 recounts when it receives the first detection pulse ATDX, and generates a counting value when it receives the second detection pulse ATDY. Therefore, the counting value generated by the counting device 511 is proportional to the magnitude of the delay time.

Moreover, when the delay time is greater than the predetermined time, the controller 510 generates the boost pulse P41 and resets the enable pulse P42. Namely at this time, the controller 510 enables the boost clock signal KICKB and the level of the signal ENBOOST is switched from a low state to a high state so as to form the enable pulse P42. When the delay time is smaller or equal to the predetermined time, the controller 510 does not generate the boost pulse P41 and does not reset the enable pulse P42. Namely at this time, the controller 510 disables the boost clock signal KICKB and the level of the signal ENBOOST will keep at the high state so as to stop generating the enable pulse P42. Similarly, the booster 520 and the switching device 530 perform the aforementioned operations according to the boost pulse P41 and the enable pulse P42 to switch the selection voltage VBW to the boost voltage VB4. Moreover, in an exemplary embodiment, when the controller 510 generates the boost pulse P41 and the enable pulse P42 according to the delay time, the switching device 530 can first switch the selection voltage VBW to the reference voltage VREF by using the second detection pulse ATDY before switching the selection voltage VBW to the boost voltage VB4.

In the aforementioned embodiments, the detection pulses generated by the address transfer detectors are applied to the word line boost circuit, so as to reduce the power consumption of the word line boost circuit. Moreover, in an actual application, the detection pulses generated by the address transfer detectors can also be applied for reading a sensing current of a memory cell, so as to avoid misjudging a state of the memory cell.

Figure 8:
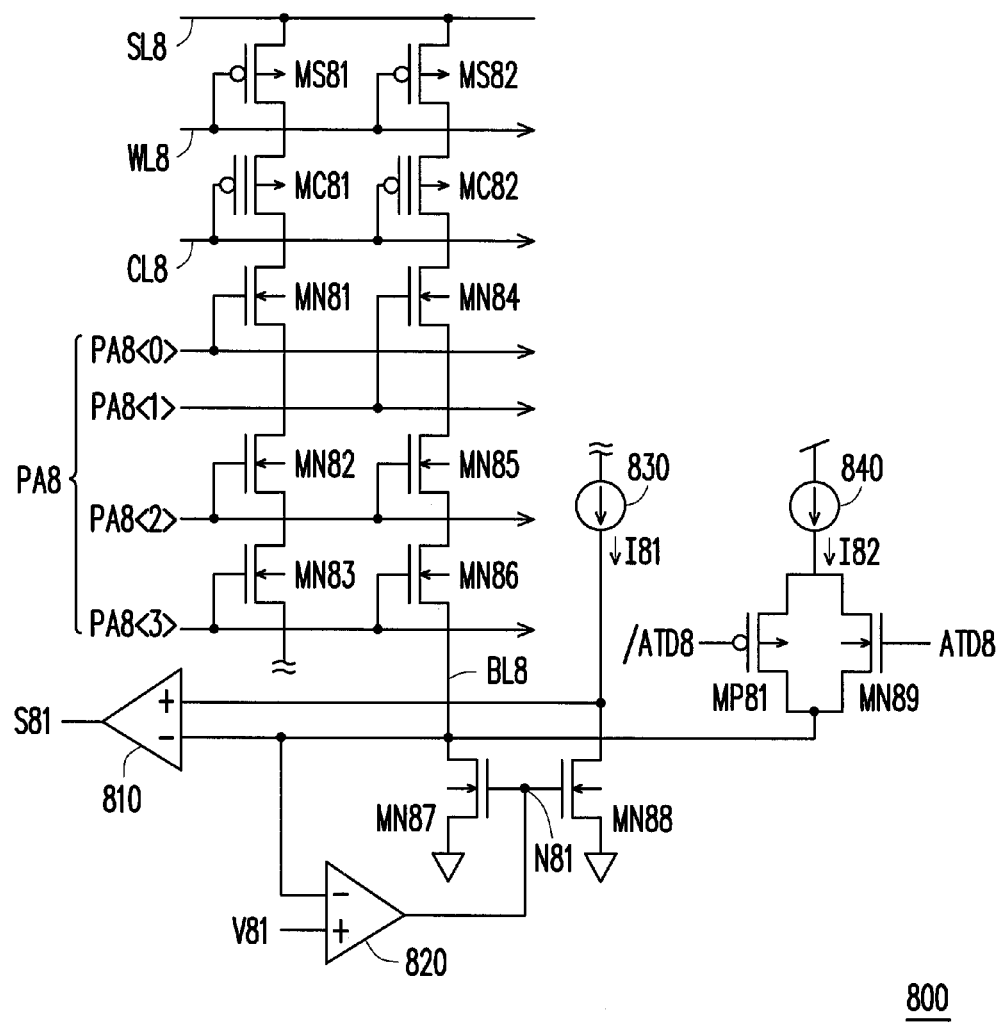
FIG. 8 is a partial circuit diagram of a memory device according to an embodiment of the invention.

For example, FIG. 8 is a partial circuit diagram of a memory device according to an embodiment of the invention. Referring to FIG. 8, the memory device 800 includes select transistors MS81-MS82, memory cells MC81-MC82, NMOS transistors MN81-MN89, a PMOS transistor MP81, a sensing amplifier 810, an operational amplifier 820, a current source 830 and a current source 840. The memory cell MC81 is electrically connected to a source line SL8 through the select transistor MS81, and gates of the memory cell MC81 and the select transistor MS81 are respectively connected to a control line CL8 and a word line WL8. Moreover, the memory cell MC82 and the select transistor MS82 have a similar connection structure.

Moreover, the select transistor MS81, the memory cell MC81 and the NMOS transistors MN81-MN83 are connected in series, and the select transistor MS82, the memory cell MC82 and the NMOS transistors MN84-MN86 are connected in series. In this way, conduction states of the NMOS transistors MN81-MN86 are controlled through front 4 bits PA8<0>-PA8<3> of an address signal PA8, so as to address to different memory cells. Moreover, a bit line BL8 is coupled to the memory cell MC82, so that a state of the memory cell MC82 can be determined according to a sensing current from the bit line BL8.

During the process of determining the state of the memory cell MC82, the operational amplifier 820 receives a voltage V81 for stabilizing a voltage on a node N81. In this way, when the bit line BL8 is fully activated, the sensing amplifier 810 generates a sensing signal S81 according to the sensing current from the bit line BL8 and a reference current I81 generated by the current source 830, so as to determine the state of the memory cell MC82. However, when the bit line BL8 is not fully activated, the sensing current from the bit line is very small. Now, if some current is not provided to the bit line BL8, the operational amplifier 820 cannot stabilize the voltage on the node N81, and the sensing amplifier 810 may generate an error sensing signal S81.

Therefore, in order to avoid the above situation, when the bit line BL8 is not fully activated, a transmission gate formed by the NMOS transistor MN89 and the PMOS transistor MP81 temporarily provides a pre-charge current I82 generated by the current source 840 to the bit line BL8 according to a detection pulse ATD8. The detection pulse ATD8 is a signal generated by an address transfer detector (not shown) in the memory device 800. In this way, during a period that the bit line BL8 is not fully activated, the operational amplifier 820 can first stabilize the voltage on the node N81 by using the pre-charge current I82. In an exemplary embodiment, the pre-charge current I82 generated by the current source 840 is 0.5 times of the reference current I81.

In summary, the first address transfer detector is used to generate the first detection pulse related to the row address signal, and the second address transfer detector is used to generate the second detection pulse related to the column address signal. Moreover, the boost operation unit determines whether or not to perform a boost operation according to a delay time between the first detection pulse and the second detection pulse. Therefore, when the column address of the selected memory unit is changed, the boost operation unit can selectively perform the boost operation, so as to reduce the power consumption of the word line boost circuit.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A word line boost circuit, comprising:
   a first address transfer detector, generating a first detection pulse in response to variation of a row address signal;
   a second address transfer detector, generating a second detection pulse in response to variation of a column address signal; and
   a boost operation unit, generating a selection voltage by using a boost voltage according to the first detection pulse, and determining whether or not to use the boost voltage to generate the selection voltage according to a delay time between the first detection pulse and the second detection pulse.

2. The word line boost circuit as claimed in claim 1, wherein the boost operation unit comprises:
   a controller, sequentially generating a boost pulse and an enable pulse according to the first detection pulse, and determining whether or not to sequentially generate the boost pulse and the enable pulse according to the delay time;
   a booster, generating the boost voltage according to the boost pulse; and
   a switching device, switching the selection voltage to the boost voltage according to the enable pulse.

3. The word line boost circuit as claimed in claim 2, wherein the switching device switches the selection voltage to a reference voltage according to the first detection pulse or the second detection pulse.

4. The word line boost circuit as claimed in claim 2, wherein when the delay time is greater than a predetermined time, the controller sequentially generates the boost pulse and the enable pulse, and when the delay time is smaller than or equal to the predetermined time, the controller does not generate the boost pulse.

5. The word line boost circuit as claimed in claim 2, wherein the controller comprises:
a counting device, recounting when it receives the first detection pulse, and generating a counting value when it receives the second detection pulse, wherein the controller determines a magnitude of the delay time according to the counting value.

6. The word line boost circuit as claimed in claim 2, wherein the booster comprises:
a first P-channel metal oxide semiconductor (PMOS) transistor, having a source receiving a ground voltage;
a second PMOS transistor, having a source receiving the ground voltage, a gate electrically connected to a drain of the first PMOS transistor, and a drain electrically connected to a gate of the first PMOS transistor, and generating the boost voltage;
a first capacitor, having a first end electrically connected to the drain of the first PMOS transistor;
a second capacitor, having a first end electrically connected to the drain of the second PMOS transistor;
a first inverter, having an input terminal receiving a boost clock signal, and an output terminal electrically connected to a second end of the first capacitor; and
a second inverter, having an input terminal electrically connected to the output terminal of the first inverter, and an output terminal electrically connected to a second end of the second capacitor.

7. The word line boost circuit as claimed in claim 1, wherein when the delay time is greater than a predetermined time, the boost operation unit generates the selection voltage by using the boost voltage, and when the delay time is smaller than or equal to the predetermined time, the boost operation unit will not re-generate the boost voltage.

8. A word line boost circuit, comprising:
a first address transfer detector, determining whether or not to generate a first detection pulse according to a row address signal;
a second address transfer detector, determining whether or not to generate a second detection pulse according to a column address signal; and
a boost operation unit, switching a selection voltage to a boost voltage according to the first detection pulse, and determining whether or not to switch the selection voltage to the boost voltage according to a delay time between the first detection pulse and the second detection pulse.

9. The word line boost circuit as claimed in claim 8, wherein the boost operation unit comprises:
a controller, sequentially generating a boost pulse and an enable pulse according to the first detection pulse, and determining whether or not to sequentially generate the boost pulse and the enable pulse according to the delay time;
a booster, generating the boost voltage according to the boost pulse; and
a switching device, switching the selection voltage to the boost voltage according to the enable pulse.

10. The word line boost circuit as claimed in claim 9, wherein the switching device switches the selection voltage to a reference voltage according to the first detection pulse or the second detection pulse.

11. The word line boost circuit as claimed in claim 9, wherein when the delay time is greater than a predetermined time, the controller sequentially generates the boost pulse and the enable pulse, and when the delay time is smaller than or equal to the predetermined time, the controller does not generate the boost pulse.

12. The word line boost circuit as claimed in claim 9, wherein the controller comprises:
a counting device, recounting when it receives the first detection pulse, and generating a counting value when it receives the second detection pulse, wherein the controller determines a magnitude of the delay time according to the counting value.

13. The word line boost circuit as claimed in claim 9, wherein the booster comprises:
a first P-channel metal oxide semiconductor (PMOS) transistor, having a source receiving a ground voltage;
a second PMOS transistor, having a source receiving the ground voltage, a gate electrically connected to a drain of the first PMOS transistor, and a drain electrically connected to a gate of the first PMOS transistor, and generating the boost voltage;
a first capacitor, having a first end electrically connected to the drain of the first PMOS transistor;
a second capacitor, having a first end electrically connected to the drain of the second PMOS transistor;
a first inverter, having an input terminal receiving a boost clock signal, and an output terminal electrically connected to a second end of the first capacitor; and
a second inverter, having an input terminal electrically connected to the output terminal of the first inverter, and an output terminal electrically connected to a second end of the second capacitor.

14. The word line boost circuit as claimed in claim 8, wherein when the delay time is greater than a predetermined time, the boost operation unit switches the selection voltage to the boost voltage, and when the delay time is smaller than or equal to the predetermined time, the boost operation unit stops re-generating the boost voltage.

15. A word line boost circuit for boosting a boost voltage in a memory array which designates a selected memory cell by a word line address and a bit line address, comprising:
a first address transfer detector for detecting variation of the word line address;
a second address transfer detector for detecting variation of the bit line address; and
a boost operation unit, generating a boost clock signal according to the detected results of the first address transfer detector and the second address transfer detector wherein the boost clock is disabled when the selected memory cell is designated at the same word line address.

16. The word line boost circuit as claimed in claim 15, wherein when the variation of the word line address is detected, the first address transfer detector generates a first detection pulse, and when the variation of the bit line address is detected, the second address transfer detector generates a second detection pulse.

17. The word line boost circuit as claimed in claim 16, wherein the boost operation unit comprises:
a controller, enabling the boost clock signal and generating an enable pulse according to the first detection pulse, and determining whether or not to enable the boost clock signal and generate the enable pulse according to a delay time between the first detection pulse and the second detection pulse;
a booster, generating the boost voltage according to the boost clock signal; and a switching device, switching a selection voltage to the boost voltage according to the enable pulse, wherein the selection voltage is applied to the selected memory cell.

18. The word line boost circuit as claimed in claim 17, wherein the switching device switches the selection voltage to a reference voltage according to the first detection pulse or the second detection pulse.

19. The word line boost circuit as claimed in claim 17, wherein when the delay time is greater than a predetermined time, the controller enables the boost clock signal and generates the enable pulse, and when the delay time is smaller than or equal to the predetermined time, the controller disables the boost clock signal.

20. The word line boost circuit as claimed in claim 17, wherein the controller comprises:
a counting device, recounting when it receives the first detection pulse, and generating a counting value when it receives the second detection pulse, wherein the controller determines a magnitude of the delay time according to the counting value.

* * * * *